US012753577B2

(12) United States Patent
Wu

(10) Patent No.: US 12,753,577 B2
(45) Date of Patent: Oct. 6, 2026

(54) CONSTRUCTION ASSIST SYSTEM FOR SHOVEL

(71) Applicant: SUMITOMO HEAVY INDUSTRIES, LTD., Tokyo (JP)

(72) Inventor: Chunnan Wu, Kanagawa (JP)

(73) Assignee: SUMITOMO HEAVY INDUSTRIES, LTD., Tokyo (JP)

(*) Notice: Subject to any disclaimer, the term of this patent is extended or adjusted under 35 U.S.C. 154(b) by 248 days.

(21) Appl. No.: 18/055,467

(22) Filed: Nov. 15, 2022

(65) Prior Publication Data

US 2023/0071015 A1 Mar. 9, 2023

Related U.S. Application Data

(63) Continuation of application No. PCT/JP2021/020303, filed on May 27, 2021.

(30) Foreign Application Priority Data

May 27, 2020 (JP) ................................ 2020-092622

(51) Int. Cl.

| | |
|---|---|
| ***E02F 9/20*** | (2006.01) |
| ***E02F 3/43*** | (2006.01) |
| ***E02F 9/22*** | (2006.01) |
| ***E02F 9/26*** | (2006.01) |
| ***G06F 30/20*** | (2020.01) |

(52) U.S. Cl.

CPC .............. *E02F 9/205* (2013.01); *E02F 3/435* (2013.01); *E02F 9/261* (2013.01); *G06F 30/20* (2020.01); *E02F 9/2228* (2013.01); *E02F 9/2285* (2013.01); *E02F 9/2292* (2013.01); *E02F 9/2296* (2013.01)

(58) Field of Classification Search

CPC . E02F 9/205; E02F 3/435; E02F 9/261; E02F 9/2228; E02F 9/2285; E02F 9/2292; E02F 9/2296; E02F 9/268; E02F 3/437; E02F 9/262; E02F 9/265; E02F 9/22; E02F 9/26; G06F 30/20; G06F 30/13; G06F 30/15; G06F 3/01; G06Q 50/08; G06T 19/006; B60Y 2200/412

See application file for complete search history.

(56) References Cited

U.S. PATENT DOCUMENTS 11,200,761 B2 * 12/2021 Onishi ..................... G07C 3/08
2006/0034535 A1 2/2006 Koch et al.

(Continued)

FOREIGN PATENT DOCUMENTS

GB 2332537 A * 6/1999 .............. E02F 3/435
JP H05-311692 11/1993

(Continued)

OTHER PUBLICATIONS

Machine translation—GB2332537A (Year: 1999).*

(Continued)

*Primary Examiner* — Scott A Browne
*Assistant Examiner* — Lidia Kwiatkowska
(74) *Attorney, Agent, or Firm* — IPUSA, PLLC

(57) ABSTRACT

A construction assist system that assists construction with a shovel includes a hardware processor configured to simulate the motion of the shovel in a virtual environment that is set based on the work environment of the shovel.

17 Claims, 8 Drawing Sheets

(56) References Cited

U.S. PATENT DOCUMENTS

| | | | | |
|---|---|---|---|---|
| 2008/0180523 | A1 | 7/2008 | Stratton et al. | |
| 2014/0200863 | A1* | 7/2014 | Kamat | E02F 9/245 703/1 |
| 2016/0247332 | A1 | 8/2016 | Egawa | |
| 2018/0374168 | A1 | 12/2018 | Kano et al. | |
| 2020/0074766 | A1 | 3/2020 | Onishi et al. | |
| 2020/0299933 | A1* | 9/2020 | Wu | E02F 9/265 |
| 2021/0248537 | A1 | 8/2021 | Saiki et al. | |
| 2021/0285184 | A1 | 9/2021 | Tanimoto et al. | |
| 2024/0044107 | A1* | 2/2024 | Sano | E02F 9/265 |

FOREIGN PATENT DOCUMENTS

| | | | |
|---|---|---|---|
| JP | H10-254545 | 9/1998 | |
| JP | 2002-115271 | 4/2002 | |
| JP | 2003-090130 | 3/2003 | |
| JP | 2003-118981 | 4/2003 | |
| JP | 2004-252024 | 9/2004 | |
| JP | 2006-053922 | 2/2006 | |
| JP | 2013-147334 | 8/2013 | |
| JP | 2016-061054 | 4/2016 | |
| JP | 2016-156193 | 9/2016 | |
| JP | 2018-092511 | 6/2018 | |
| JP | 2019-207570 | 12/2019 | |
| JP | 2019207570 A * | 12/2019 | G09B 9/052 |
| WO | 2017/170968 | 10/2017 | |
| WO | 2018/043299 | 3/2018 | |
| WO | 2019/017159 | 1/2019 | |

OTHER PUBLICATIONS

Machine translation—JP2019207570A (Year: 2019).*

International Search Report for PCT/JP2021/020303 mailed on Jul. 20, 2021.

* cited by examiner

CONSTRUCTION ASSIST SYSTEM FOR SHOVEL

CROSS-REFERENCE TO RELATED APPLICATIONS

This application is a continuation application filed under 35 U.S.C. 111(a) claiming benefit under 35 U.S.C. 120 and 365(c) of PCT International Application No. PCT/JP2021/020303, filed on May 27, 2021 and designating the U.S., which claims priority to Japanese Patent Application No. 2020-092622, filed on May 27, 2020. The entire contents of the foregoing applications are incorporated herein by reference.

BACKGROUND

Technical Field

The present disclosure relates to construction assist systems for a shovel.

Description of Related Art

An operation assist system that assists an operator of a construction machine using operation data of high work quality among the past operation data of the construction machine is known.

SUMMARY

According to an aspect of the present invention, a construction assist system that assists construction with a shovel includes a hardware processor configured to simulate the motion of the shovel in a virtual environment that is set based on the work environment of the shovel.

DETAILED DESCRIPTION

The related-art system merely uses the operation data of the best workers in the past, and does not reflect the actual situation in a worksite.

Therefore, it is desired to provide a construction assist system for a shovel that can reflect the actual situation in a worksite when assisting in construction with a shovel.

According to an aspect of the present invention, a construction assist system for a shovel that can reflect the actual situation in a worksite at the time of assisting in construction with a shovel is provided.

Next, a non-limiting illustrative embodiment of the present invention is described with reference to the accompanying drawings.

Figure 1:
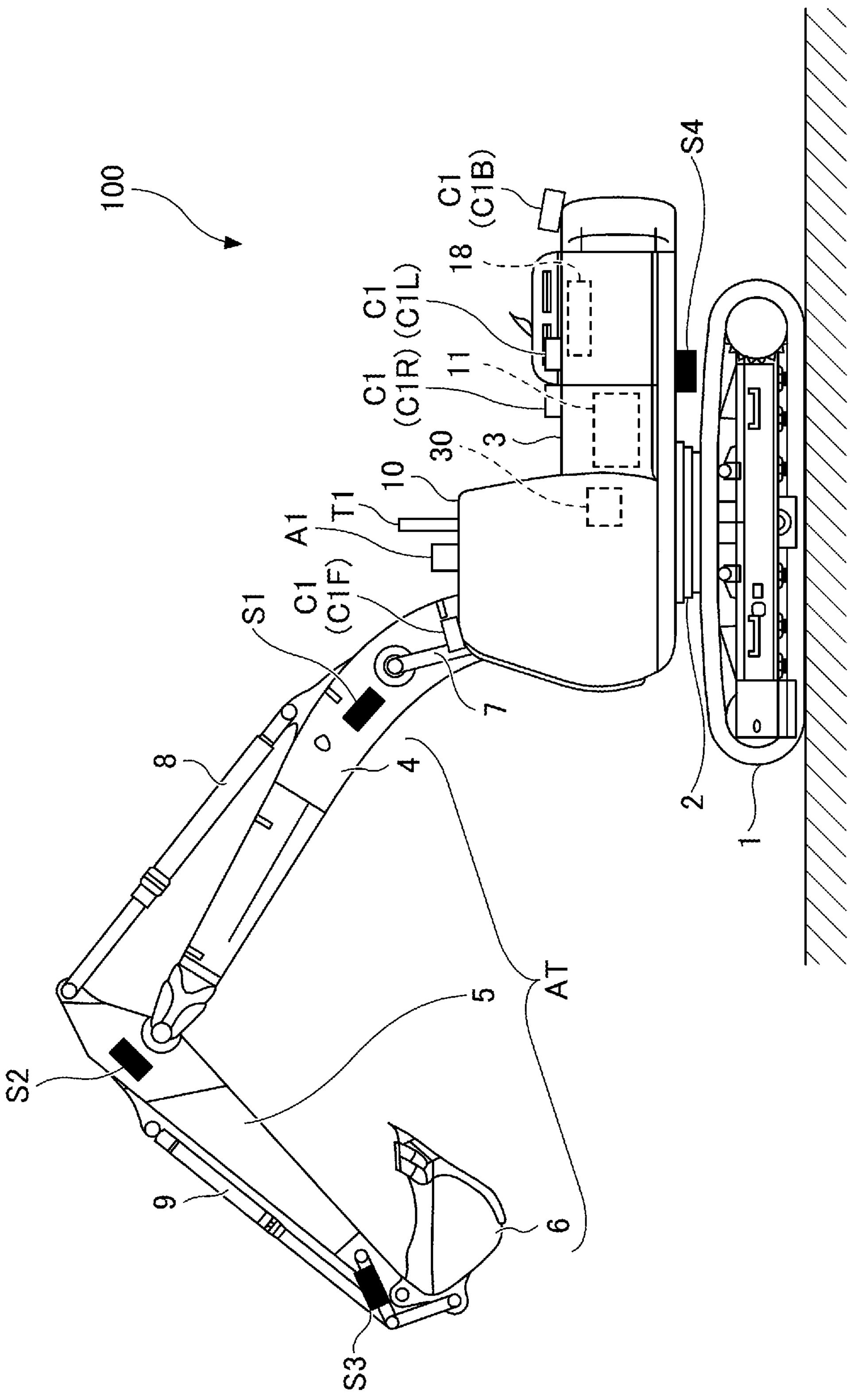
FIG. 1 is a side view of a shovel.

FIG. 1 illustrates a shovel 100 serving as an excavator according to an embodiment of the present invention. An upper swing structure 3 is swingably mounted on a lower traveling structure 1 of the shovel 100 via a swing mechanism 2. A boom 4 is attached to the upper swing structure 3. An aim 5 is attached to the distal end of the boom 4. A bucket 6 serving as an end attachment is attached to the distal end of the arm 5.

The boom 4, the arm 5, and the bucket 6 constitute an excavation attachment AT, which is an example of an attachment. The boom 4 is driven by a boom cylinder 7. The arm 5 is driven by an arm cylinder 8. The bucket 6 is driven by a bucket cylinder 9.

A boom angle sensor S1 is attached to the boom 4. An arm angle sensor S2 is attached to the aim 5. A bucket angle sensor S3 is attached to a bucket link. A swing angular velocity sensor S4 is attached to the upper swing structure 3.

The boom angle sensor S1 is one of pose detection sensors and is configured to detect the pivot angle of the boom 4. According to this embodiment, the boom angle sensor S1 is a stroke sensor that detects the stroke amount of the boom cylinder 7, and derives the pivot angle of the boom 4 about a boom foot pin that connects the upper swing structure 3 and the boom 4 based on the stroke amount of the boom cylinder 7.

The arm angle sensor S2 is one of pose detection sensors and is configured to detect the pivot angle of the arm 5. According to this embodiment, the aim angle sensor S2 is a stroke sensor that detects the stroke amount of the arm cylinder 8, and derives the pivot angle of the arm 5 about a connecting pin that connects the boom 4 and the arm 5 based on the stroke amount of the arm cylinder 8.

The bucket angle sensor S3 is one of pose detection sensors and is configured to detect the pivot angle of the bucket 6. According to this embodiment, the bucket angle sensor S3 is a stroke sensor that detects the stroke amount of the bucket cylinder 9, and derives the pivot angle of the bucket 6 about a connecting pin that connects the arm 5 and the bucket 6 based on the stroke amount of the bucket cylinder 9.

Each of the boom angle sensor S1, the arm angle sensor S2, and the bucket angle sensor S3 may be a rotary encoder, an acceleration sensor, a potentiometer (variable resistor), an inclination sensor, an inertial measurement unit or the like. The inertial measurement unit may be constituted of, for example, a combination of an acceleration sensor and a gyroscope.

The swing angular velocity sensor S4 is configured to detect the swing angular velocity of the upper swing structure 3. According to this embodiment, the swing angular velocity sensor S4 is a gyroscope. The swing angular velocity sensor S4 may be configured to calculate a swing angle based on the swing angular velocity. The swing angular velocity sensor S4 may be constituted of other sensors such as a rotary encoder.

A cabin 10 serving as a cab, an engine 11, a positioning device 18, a sound collector A1, a space recognition device C1, a communications device T1, etc., are mounted on the upper swing structure 3. Furthermore, a controller 30 is installed in the cabin 10. In addition, an operator seat, an operating device, etc., are installed in the cabin 10. The shovel 100, however, may be an unmanned shovel without the cabin 10.

The engine 11 serving as a prime mover is the drive source of the shovel 100. According to this embodiment, the engine 11 is a diesel engine. The output shaft of the engine 11 is connected to the respective input shafts of a main pump 14 and a pilot pump 15. The main pump 14 may be driven by an electric motor driven with electric power from a power storage instead of the engine 11.

The positioning device 18 is configured to measure the position of the shovel 100. According to this embodiment, the positioning device 18 is a GNSS compass and is configured to be able to measure the position and the orientation of the upper swing structure 3.

The sound collector A1 is configured to collect sounds generated around the shovel 100. According to this embodiment, the sound collector A1 is a microphone attached to the upper swing structure 3.

The space recognition device C1 is configured to be able to recognize a space around the shovel 100. According to this embodiment, the space recognition device C1 is an image capturing device such as a monocular camera, a stereo camera, or an infrared camera. According to the illustrated example, the space recognition device C1 is a monocular camera with an imaging device such as a CCD or a CMOS. Specifically, the space recognition device C1 includes a back camera C1B attached to the back end of the upper surface of the upper swing structure 3, a front camera C1F attached to the front end of the upper surface of the cabin 10, a left camera C1L attached to the left end of the upper surface of the upper swing structure 3, and a right camera C1R attached to the right end of the upper surface of the upper swing structure 3. The space recognition device C1 may be a full sphere camera installed at a predetermined position in the cabin 10. The predetermined position is, for example, a position corresponding to the eye position of an operator seated in the operator seat installed in the cabin 10.

The space recognition device C1 may be a LIDAR, an ultrasonic sensor, a millimeter wave radar, a laser radar, an infrared sensor, or the like (hereinafter referred to as "LIDAR or the like"). The space recognition device C1 as a LIDAR or the like may detect a distance from the space recognition device C1 to an object and the direction of the object as seen from the space recognition device C1 by transmitting multiple signals (laser lights or the like) toward the object and receiving the reflected signals.

The space recognition device C1 may be configured to detect objects present in an area surrounding the shovel 100. Examples of objects include topographical features (inclines, holes, etc.), dump trucks, electric wires, utility poles, persons, animals, vehicles, construction machines, buildings, walls, helmets, safety vests, work-clothes, and predetermined marks on helmets. In this case, the space recognition device C1 may be configured to identify at least one of the type, the position, the shape, etc., of the object. In addition, the space recognition device C1 may be configured to distinguish between a person and a non-human object.

If it is determined by the space recognition device C1 that a person is present within a predetermined distance from the shovel 100 before an actuator operates, the controller 30 may disable the actuator or cause the actuator to operate very slowly even when the operator operates an operating lever. Specifically, in response to determining that a person is present within a predetermined distance from the shovel 100, the controller 30 may disable the actuator by putting a gate lock valve in a locking state. In the case of an electric operating lever, the controller 30 may disable the actuator by disabling a signal to a control valve for operation. The control valve for operation is configured to output a pilot pressure corresponding to a control command from the controller 30 and apply the pilot pressure to a pilot port of a corresponding control valve in a control valve unit 17. The same applies in the case of using another type of operating lever if a control valve for operation is used. When it is desired to cause the actuator to operate very slowly, the controller 30 may cause the actuator to operate very slowly by diminishing a signal (for example, the value of a current signal) to the control valve for operation. Thus, when it is determined that a person is present within a predetermined distance from the shovel 100, the actuator is not driven or is driven very slowly with an output smaller than an output corresponding to an input to an operating device even when the operating device is operated. Furthermore, when it is determined that a person is present within a predetermined distance from the shovel 100 while the operator is operating an operating lever, the controller 30 may stop or decelerate the operation of the actuator independent of the operator's operation details. Specifically, when it is determined that a person is present within a predetermined distance from the shovel 100, the controller 30 stops the actuator by putting the gate lock lever in a locking state. When the control valve for operation is used, the controller 30 may disable the actuator or cause the actuator to operate very slowly by disabling a signal to the control valve for operation or output a deceleration command to the control valve for operation. Furthermore, when an object detected by the space recognition device C1 is a dump truck, stop control is unnecessary. In this case, the actuator is so controlled as to avoid the detected dump truck. Thus, the actuator may be controlled based on the recognized type of the detected object.

The communications device T1 is configured to control communications with apparatuses outside the shovel 100. According to this embodiment, the communications device T1 is configured to control radio communications between the communications device T1 and apparatuses outside the shovel 100 via a radio communication network.

The controller 30 is a processor that executes various operations. According to this embodiment, the controller 30 is composed of a microcomputer including a CPU and a memory 30*a*. Various functions of the controller 30 are implemented by the CPU executing programs stored in the memory 30*a*.

Figure 2:
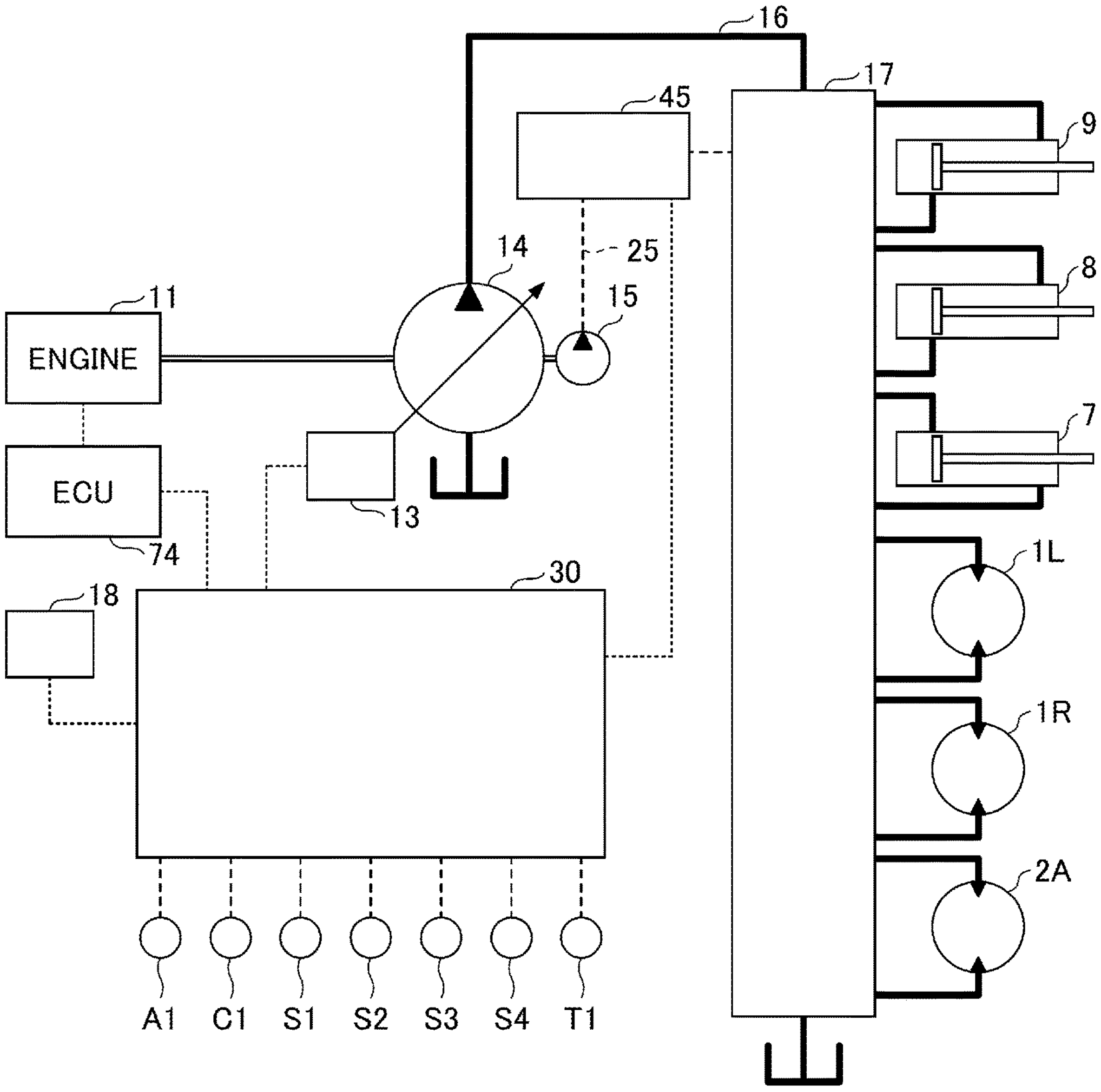
FIG. 2 is a diagram illustrating an example configuration of a drive system installed in the shovel of FIG. 1.

FIG. 2 is a block diagram illustrating an example configuration of the drive system of the shovel 100 of FIG. 1. In FIG. 2, a mechanical power transmission line, a hydraulic oil line, a pilot line, and an electrical control line are indicated by a double line, a thick solid line, a dashed line, and a dotted line, respectively.

The drive system of the shovel 100 is constituted of the engine 11, a regulator 13, the main pump 14, the pilot pump 15, the control valve unit 17, the controller 30, a solenoid valve unit 45, etc. The engine 11 is driven and controlled by an engine control unit 74.

The main pump 14 supplies hydraulic oil to the control valve unit 17 via a hydraulic oil line 16. According to this embodiment, the main pump 14 is a swash plate variable displacement hydraulic pump.

The regulator 13 is configured to control the discharge quantity of the main pump 14. According to this embodiment, the regulator 13 is configured to adjust the swash plate tilt angle of the main pump 14 according to the discharge pressure of the main pump 14, a control signal from the controller 30, or the like. The discharge quantity (geometric displacement) per revolution of the main pump 14 is controlled by the regulator 13.

The pilot pump 15 is configured to supply hydraulic oil to various hydraulic control devices via a pilot line 25. According to this embodiment, the pilot pump 15 is a fixed displacement hydraulic pump. The pilot pump 15, however, may be omitted. In this case, the function carried by the pilot pump 15 may be implemented by the main pump 14. That is, apart from the function of supplying hydraulic oil to the control valve unit 17, the main pump 14 may have the function of supplying hydraulic oil to the solenoid valve unit 45, etc., via a throttle or the like.

The control valve unit 17 is configured to be able to selectively supply hydraulic oil received from the main pump 14 to one or more hydraulic actuators. According to this embodiment, the control valve unit 17 includes multiple control valves corresponding to multiple hydraulic actuators. The control valve unit 17 is configured to be able to selectively supply hydraulic oil discharged from the main pump 14 to one or more hydraulic actuators. Examples of hydraulic actuators include the boom cylinder 7, the arm cylinder 8, the bucket cylinder 9, a left travel hydraulic motor 1L, a right travel hydraulic motor 1R, and a swing hydraulic motor 2A.

The controller 30 is configured to control the solenoid valve unit 45 based on an operation signal received through the communications device T1. According to this embodiment, the operation signal is transmitted from a remote control room. The operating signal may be generated by an operating device provided in the cabin 10.

The solenoid valve unit 45 includes multiple solenoid valves placed in each pilot line 25 connecting the pilot pump 15 to a pilot port of each control valve in the control valve unit 17.

According to this embodiment, the controller 30 may control a pilot pressure applied to a pilot port of each control valve by individually controlling the opening area of each of the solenoid valves. Therefore, the controller 30 can control the flow rate of hydraulic oil flowing into each hydraulic actuator and the flow rate of hydraulic oil flowing out of each hydraulic actuator, and can further control the movement of each hydraulic actuator.

Thus, the controller 30 can realize the raising and lowering of the boom 4, the opening and closing of the arm 5, the opening and closing of the bucket 6, the swing of the upper swing structure 3, the travel of the lower traveling structure 1, etc., in response to operation signals from the outside such as the remote control room.

Figure 3:
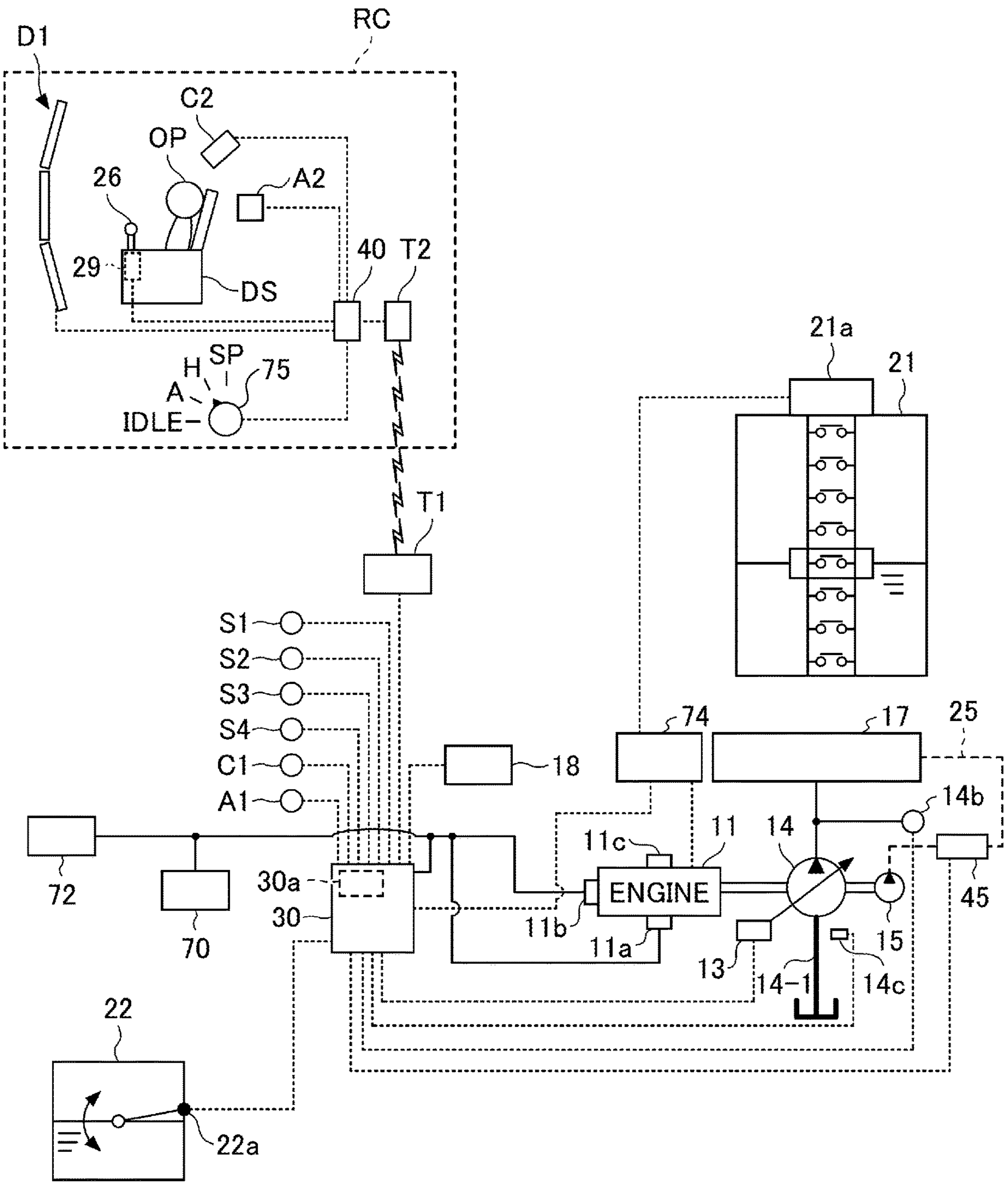
FIG. 3 is a diagram illustrating an example configuration of an electrical system installed in the shovel of FIG. 1.

FIG. 3 is a diagram illustrating an example configuration of an electrical system installed in the shovel 100 of FIG. 1. As illustrated in FIG. 3, the engine 11 is connected to the engine control unit 74. Various data indicating the condition of the engine 11 are transmitted from the engine control unit 74 to the controller 30. The controller 30 is configured to be able to store various data indicating the condition of the engine 11 in the memory 30*a*.

A battery 70 is configured to supply electric power to various electrical loads installed in the shovel 100. An alternator 11*a* (generator), a starter 11*b*, the controller 30, electrical equipment 72, etc., are configured to operate with electric power stored in the battery 70. The starter 11*b* is configured to be driven with electric power stored in the battery 70 to start the engine 11. The battery 70 is configured to be charged with electric power generated by the alternator 11*a*.

A water temperature sensor 11*c* transmits data on the temperature of engine coolant to the controller 30. The regulator 13 transmits data on the swash plate tilt angle to the controller 30. A discharge pressure sensor 14*b* transmits data on the discharge pressure of the main pump 14 to the controller 30. The positioning device 18 transmits data on the position of the shovel 100 to the controller 30.

An oil temperature sensor 14*c* is provided in a conduit 14-1 between the main pump 14 and a hydraulic oil tank in which hydraulic oil taken in by the main pump 14 is stored. The oil temperature sensor 14*c* transmits data on the temperature of hydraulic oil flowing through the conduit 14-1 to the controller 30.

An aqueous urea solution remaining amount sensor 21*a* provided in an aqueous urea solution tank 21 transmits data on the remaining amount of an aqueous urea solution to the controller 30. A fuel remaining amount sensor 22*a* provided in a fuel tank 22 transmits data on the remaining amount of fuel to the controller 30.

The communications device T1 is configured to transmit and receive information to and from a communications device T2 installed in a remote control room RC via radio communications. According to this embodiment, the communications device T1 and the communications device T2 are configured to transmit and receive information via a fifth-generation mobile communication line (5G line), an LTE line, a satellite line, or the like.

A remote controller 40, a sound output device A2, an indoor space recognition device C2, a display device D1, the communications device T2, etc., are installed in the remote control room RC. Furthermore, an operator seat DS in which an operator OP who remotely controls the shovel 100 sits is installed in the remote control room RC.

The remote controller 40 is a processor that executes various operations. According to this embodiment, the remote controller 40 is composed of a microcomputer including a CPU and a memory, the same as the controller 30. Various functions of the remote controller 40 are implemented by the CPU executing programs stored in the memory.

The sound output device A2 is configured to output sounds. According to this embodiment, the sound output device A2 is a loudspeaker and is configured to reproduce sounds collected by the sound collector A1 attached to the shovel 100.

The indoor space recognition device C2 is configured to be able to recognize a space in the remote control room RC. According to this embodiment, the indoor space recognition device C2 is a camera installed inside the remote control room RC and is configured to capture an image of the operator OP seated in the operator seat DS.

The communications device T2 is configured to control radio communications with the communications device T1 attached to the shovel 100.

According to this embodiment, the operator seat DS has the same structure as a normal operator seat installed in the cabin of a shovel. Specifically, a left console box is placed on the left side of the operator seat DS, and a right console box is placed on the right side of the operator seat DS. A left operating lever is positioned at the front end of the upper surface of the left console box, and a right operating lever is positioned at the front end of the upper surface of the right console box. Furthermore, travel levers and travel pedals are placed in front of the operator seat DS. In addition, a dial 75 is positioned in the center of the upper surface of the right console box. The left operating lever, the right operating lever, the travel levers, the travel pedals, and the dial 75 constitute an operating device 26.

The dial 75 is a dial for adjusting the rotational speed of the engine 11, and is configured to allow the engine rotational speed to be switched between, for example, four levels.

Specifically, the dial 75 is configured to allow the engine rotational speed to be switched between the four levels of SP mode, H mode, A mode, and idling mode. The dial 75 transmits data on the setting of the engine rotational speed to the controller 30.

The SP mode is a rotational speed mode that is selected when the operator OP wishes to prioritize workload, and uses the highest engine rotational speed. The H mode is a rotational speed mode that is selected when the operator OP wishes to satisfy both workload and fuel efficiency, and uses the second highest engine rotational speed. The A mode is a rotational speed mode that is selected when the operator OP wishes to operate the shovel 100 with low noise while prioritizing fuel efficiency, and uses the third highest engine rotational speed. The idling mode is a rotational speed mode that is selected when the operator OP wishes to idle the engine 11, and uses the lowest engine rotational speed. The engine 11 is controlled to constantly rotate at the engine rotational speed of a rotational speed mode selected through the dial 75.

The operating device 26 is provided with an operation sensor 29 for detecting the operation details of the operating device 26. The operation sensor 29 is, for example, an inclination sensor to detect the inclination angle of an operating lever, an angle sensor to detect the pivot angle of an operating lever about its pivot axis, or the like. The operation sensor 29 may be constituted of another sensor such as a pressure sensor, a current sensor, a voltage sensor, or a distance sensor. The operation sensor 29 outputs information on the detected operation details of the operating device 26 to the remote controller 40. The remote controller 40 generates an operation signal based on the received information and transmits the generated operation signal to the shovel 100. The operation sensor 29 may be configured to generate an operation signal. In this case, the operation sensor 29 may output the operation signal to the communications device T2, bypassing the remote controller 40.

The display device D1 is configured to display information on a situation in an area surrounding the shovel 100. According to this embodiment, the display device D1 is a multi-display constituted of nine monitors in three vertical rows and three lateral columns, and is configured to be able to display a situation in a space in front, to the left, and to the right of the shovel 100. Each monitor is a liquid crystal monitor or an organic EL monitor. The display device D1, however, may be constituted of one or more curved monitors or a projector.

The display device D1 may be a display device wearable by the operator OP. For example, the display device D1 is a head-mounted display (VR goggles) and may be configured to transmit and receive information to and from the remote controller 40 through radio communications. The head-mounted display may be wired to the remote controller 40. The head-mounted display may be a transmissive head-mounted display or an opaque head-mounted display. The head-mounted display may be a monocular head-mounted display or a binocular head-mounted display.

The display device D1 is configured to display an image that enables the operator OP in the remote control room RC to view an area surrounding the shovel 100. That is, the display device D1 displays an image in such a manner as to enable the operator OP in the remote control room RC to check a situation in an area surrounding the shovel 100 as if the operator OP were in the cabin 10 of the shovel 100.

Figure 4:
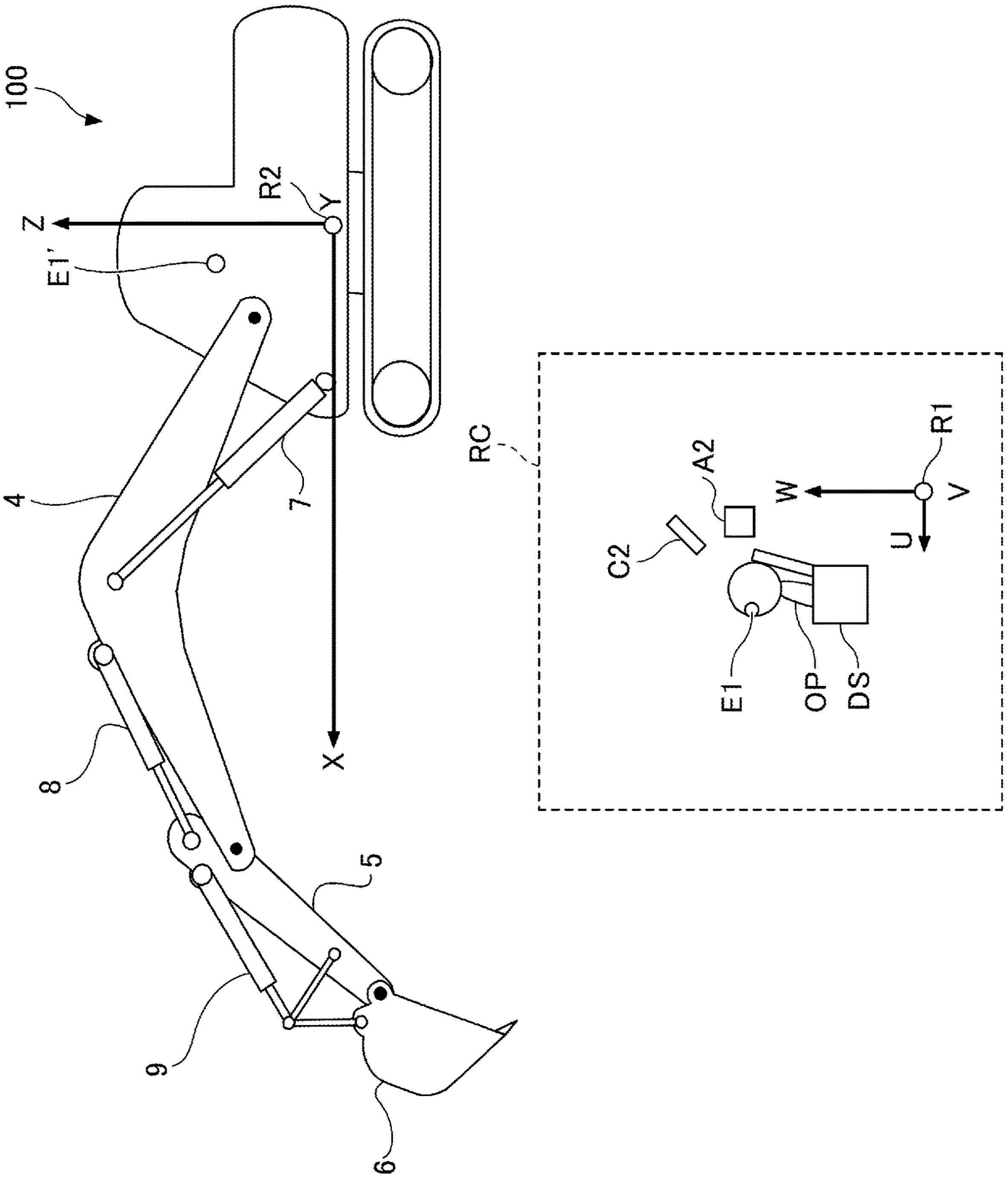
FIG. 4 is a diagram illustrating the relationship between a coordinate system related to a remote control room and a coordinate system related to the shovel.

Next, the relationship between a first coordinate system whose origin is a reference point R1 in the remote control room RC and a second coordinate system whose origin is a reference point R2 in the shovel 100 is described with reference to FIG. 4. In the following description, the first coordinate system is referred to as control room coordinate system and the second coordinate system is referred to as shovel coordinate system. FIG. 4 is a diagram illustrating the relationship between the control room coordinate system and the shovel coordinate system.

The control room coordinate system is a three-dimensional UVW Cartesian coordinate system whose origin is the reference point R1 in the remote control room RC, and has a U-axis extending parallel to the longitudinal direction of the operator seat DS, a V-axis extending parallel to the lateral direction of the operator seat DS, and a W-axis perpendicular to the U-axis and the V-axis.

The shovel coordinate system is a three-dimensional XYZ Cartesian coordinate system whose origin is the reference point R2 on the upper swing structure 3, and has an X-axis extending parallel to the longitudinal direction of the upper swing structure 3, a Y-axis extending parallel to the lateral direction of the upper swing structure 3, and a Z-axis perpendicular to the X-axis and Y-axis. According to the example of FIG. 4, the reference point R2 is a point on the swing axis, the XY plane is a horizontal plane, and the Z axis is a vertical axis. That is, according to the example of FIG. 4, a ground plane, which is a virtual plane in which the shovel 100 is positioned, is a horizontal plane. The X-axis corresponds to the U-axis of the control room coordinate system, the Y-axis corresponds to the V-axis of the control room coordinate system, and the Z-axis corresponds to the W-axis of the control room coordinate system.

According to this embodiment, each three-dimensional coordinate in the control room coordinate system is associated in advance with one of the three-dimensional coordinates in the shovel coordinate system. Therefore, when the three-dimensional coordinates of an operator's viewpoint E1, which are the eye position of the operator OP in the remote control room RC, are determined, the three-dimensional coordinates of a virtual operator's viewpoint E1', which are the eye position of a virtual operator in the shovel 100, are uniquely determined. The eye position of the operator OP is, for example, the midpoint between the left eye position and the right eye position of the operator OP. The eye position of the operator OP, however, may be a preset position. That is, the operator's viewpoint E1 and the virtual operator's viewpoint E1' may be fixed points.

The display device D1, which is installed in front of the operator OP, diagonally in front of the operator OP to the left, and diagonally in front of the operator OP to the right according to the above-described embodiment, may be installed in a polygonal tube or cylindrical shape to surround the operator OP. That is, the display device D1 may include a monitor installed behind the operator OP. Alternatively, the display device D1 may be installed hemispherically to surround the operator OP. That is, the display device D1 may include a monitor installed immediately above the operator OP.

Figure 5:
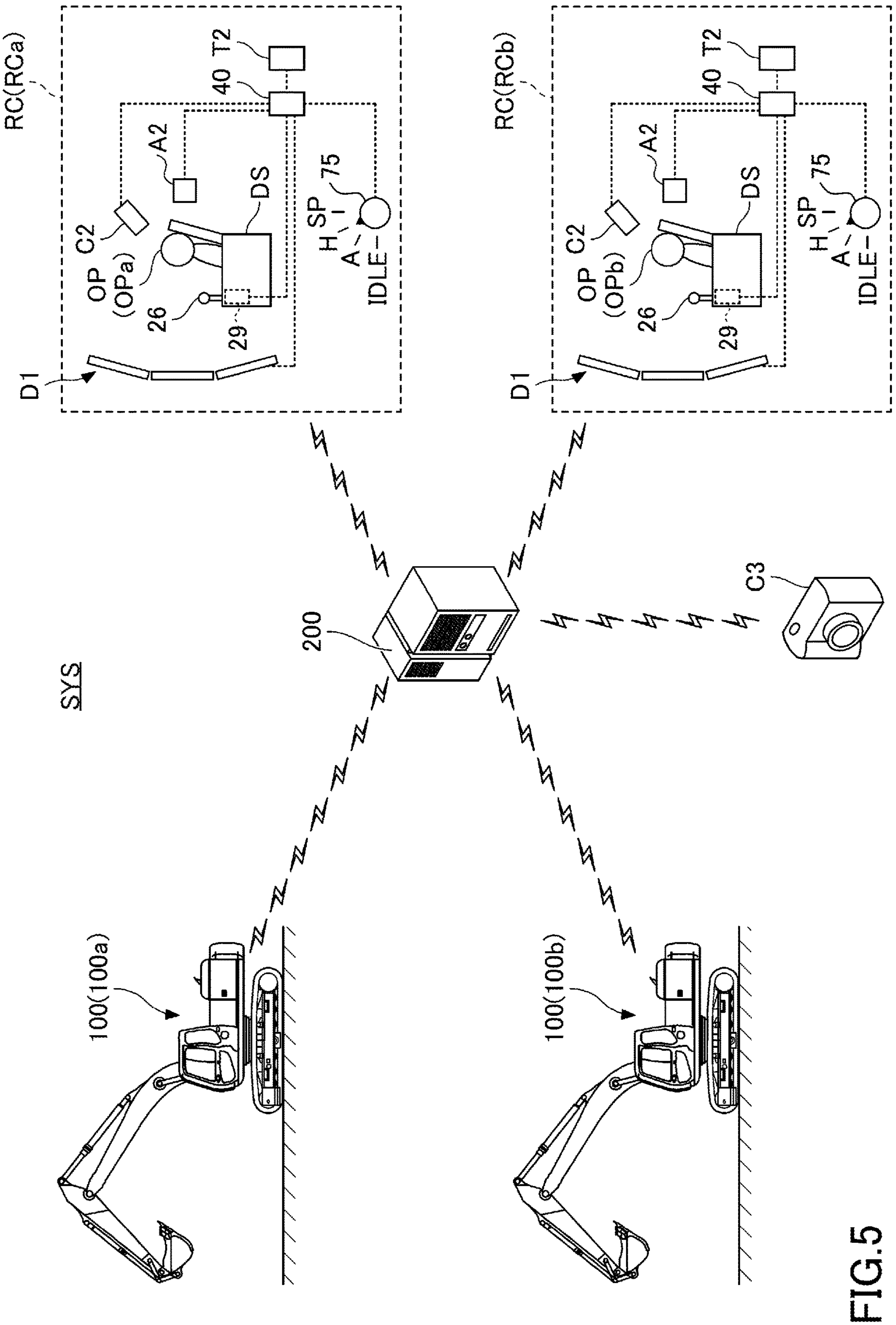
FIG. 5 is a schematic diagram illustrating an example configuration of a construction assist system.
Figure 6:
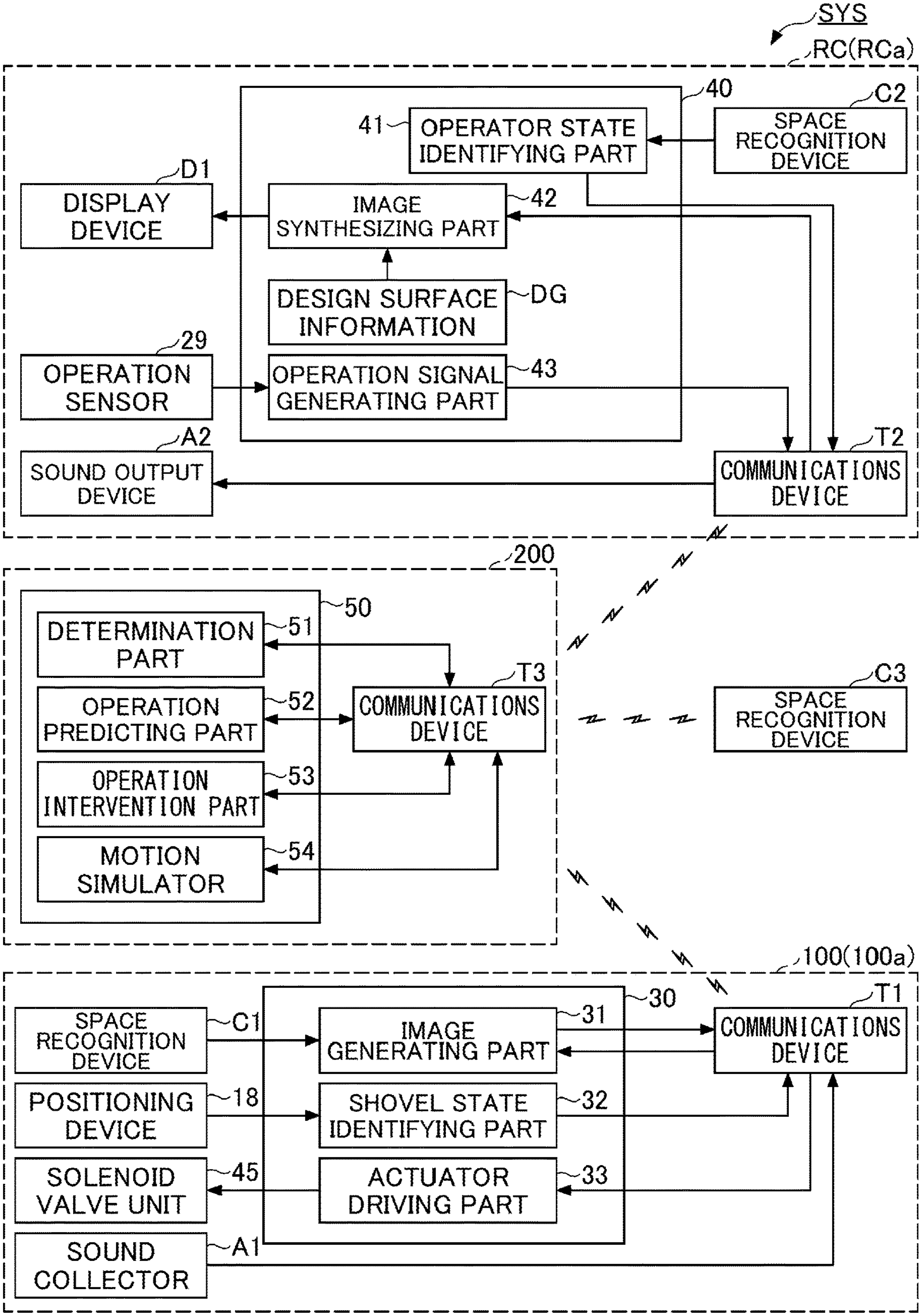
FIG. 6 is a block diagram illustrating an example configuration of the construction assist system.

Next, an example configuration of a construction assist system SYS for the shovel 100 is described with reference to FIGS. 5 and 6. FIG. 5 is a schematic diagram illustrating an example configuration of the construction assist system SYS. FIG. 6 is a functional block diagram illustrating an example configuration of the construction assist system SYS.

The construction assist system SYS is constituted mainly of the positioning device 18, the controller 30, the solenoid valve unit 45, the sound collector A1, the space recognition device C1, and the communications device T1, which are mounted on the shovel 100; the operation sensor 29, the remote controller 40, the sound output device A2, the indoor space recognition device C2, the display device D1, and the communications device T2, which are installed in the remote control room RC; and a controller 50 serving as a management apparatus and a communications device T3, which are installed in an information center 200.

According to the example illustrated in FIG. 5, the construction assist system SYS is constituted of a shovel 100*a*, a shovel 100*b*, a remote control room RCa associated with the shovel 100*a*, a remote control room RCb associated with the shovel 100*b*, a space recognition device C3 installed in a worksite, and the information center 200.

The space recognition device C3 is configured to be able to recognize a space in the worksite. According to this embodiment, the space recognition device C3 is a camera installed in the worksite and is configured to capture an image of the worksite.

First, functions of the controller 30 installed in the shovel 100*a* are described. As illustrated in FIG. 6, the controller 30 includes, as functional blocks, an image generating part 31, a shovel state identifying part 32, and an actuator driving part 33. The same is the case with the shovel 100*b*. The image generating part 31, the shovel state identifying part 32, and the actuator driving part 33, which are separately represented for the convenience of description, do not have to be physically separated and may be constituted entirely or partly of a common software component or hardware component.

The image generating part 31 is configured to generate a surrounding image including an image displayed on the display device D1. The surrounding image is an image used for display on the display device D1. Typically, the surrounding image is an image showing a situation in an area surrounding the shovel 100 that could be seen by the operator if the operator were in the cabin 10. According to this embodiment, the surrounding image is generated based on an image captured by an image capturing device serving as the space recognition device C1. Specifically, the image generating part 31 generates a first virtual viewpoint image as a surrounding image based on images captured by the back camera C1B, the front camera C1F, the left camera C1L, and the right camera C1R. The image generating part 31, however, may generate the first virtual viewpoint image as a surrounding image based on an image captured by at least one of the back camera C1B, the front camera C1F, the left camera C1L, and the right camera C1R. A first virtual viewpoint that is the virtual viewpoint of the first virtual viewpoint image is the virtual operator's viewpoint E1' (see FIG. 4), which corresponds to the eye position of the operator if the operator were seated in the operator seat in the cabin 10. The virtual operator's viewpoint E1', however, may be outside the cabin 10.

According to this embodiment, the coordinates of the virtual operator's viewpoint E1', which is the first virtual viewpoint, are derived based on the operator's viewpoint E1 (see FIG. 4) that is the eye position of the operator OP when the operator OP is seated in the operator seat DS of the remote control room RC. The coordinates of the operator's viewpoint E1 are transmitted from the remote controller 40. The image generating part 31 can derive the coordinates of the virtual operator's viewpoint E1' by converting the coordinates of the operator's viewpoint E1 in the control room coordinate system into coordinates in the shovel coordinate system. The coordinates of the operator's viewpoint E1, however, may be preset fixed values.

Furthermore, according to this embodiment, the first virtual viewpoint image corresponds to an image projected onto the inner cylindrical surface of a virtual cylindrical virtual projection plane surrounding the first virtual viewpoint. The virtual projection plane may be the inner surface of a virtual sphere or hemisphere surrounding the first virtual view point or may the inner surface of a virtual rectangular parallelepiped or cube surrounding the first virtual view point. By viewing the first virtual viewpoint image thus generated, the operator OP can three-dimensionally understand a situation in an area surrounding the shovel 100. That is, by viewing the first virtual viewpoint image thus generated, the operator OP can more accurately understand, for example, the depth of the bed of a dump truck located in front of the shovel 100, the height of a mound of earth on the ground, the depth of a hole in the ground, or the like.

An image derived from the first virtual viewpoint image displayed on the display device D1 is part of the first virtual viewpoint image generated by the image generating part 31.

When the display device D1 is a head-mounted display, the area of an image displayed on the display device D1 in the entire area of the first virtual viewpoint image may be determined based on the direction of the line of sight of the operator OP seated in the operator seat DS of the remote control room RC. In this case, information on the direction of the line of sight of the operator OP is transmitted from the remote controller 40. The image generating part 31 generates the first virtual viewpoint image as a surrounding image based on an image output by the space recognition device C1 and the coordinates of the operator's viewpoint E1 transmitted from the remote controller 40. The image generating part 31 clips part of the generated first virtual viewpoint image as a partial surrounding image based on the information on the direction of the line of sight of the operator OP transmitted from the remote controller 40, and transmits the clipped partial surrounding image to the display device D1 in the remote control room RC.

The shovel state identifying part 32 is configured to identify the state of the shovel 100. According to this embodiment, the state of the shovel 100 includes the position and orientation of the shovel 100. The position of the shovel 100 is, for example, the latitude, longitude, and altitude of the reference point R2 in the shovel 100. The shovel state identifying part 32 identifies the position and orientation of the shovel 100 based on the output of the positioning device 18.

The actuator driving part 33 is configured to drive actuators installed in the shovel 100. According to this embodiment, the actuator driving part 33 generates and outputs an actuation signal to each of solenoid valves included in the solenoid valve unit 45 based on operation signals transmitted from the remote controller 40.

In response to receiving the actuation signal, each solenoid valve increases or decreases a pilot pressure applied to a pilot port of a corresponding control valve in the control valve unit 17. As a result, a hydraulic actuator corresponding to each control valve operates at a speed commensurate with the stroke amount of the control valve.

Next, functions of the remote controller 40 installed in the remote control room RC are described. The remote controller 40 includes, as functional blocks, an operator state identifying part 41, an image synthesizing part 42, and an operation signal generating part 43. The operator state identifying part 41, the image synthesizing part 42, and the operation signal generating part 43, which are separately represented for the convenience of description, do not have to be physically separated and may be constituted entirely or partly of a common software component or hardware component.

The operator state identifying part 41 is configured to identify the state of the operator OP in the remote control room RC. The state of the operator OP includes the eye position and the direction of the line of sight of the operator OP. The operator state identifying part 41 identifies the eye position and the direction of the line of sight of the operator OP based on the output of the indoor space recognition device C2. Specifically, the operator state identifying part 41 performs various kinds of image processing on an image captured by an image capturing device serving as the indoor space recognition device C2 to identify the coordinates of the eye position of the operator OP in the control room coordinate system as the coordinates of the operator's viewpoint E1 (see FIG. 4). Furthermore, the operator state identifying part 41 performs various kinds of image processing on an image captured by an image capturing device serving as the indoor space recognition device C2 to identify the direction of the line of sight of the operator OP in the control room coordinate system.

The operator state identifying part 41 may derive the coordinates of the operator's viewpoint E1 and the direction of the line of sight of the operator OP based on the output of a device other than the indoor space recognition device C2 such as a LIDAR or the like installed in the remote control room RC or an inertial measurement unit attached to a head-mounted display serving as the display device D1. The inertial measurement unit may include a positioning device.

The operator state identifying part 41 transmits information on the coordinates of the operator's viewpoint E1 and the direction of the line of sight of the operator OP to the shovel 100 through the communications device T2.

The image synthesizing part 42 is configured to generate a composite image by synthesizing the partial surrounding image transmitted from the controller 30 and another image.

The other image may be a design surface image that is an image generated based on design surface information DG. According to this embodiment, the image synthesizing part 42 superimposes and displays a figure such as a computer-generated graphic representing the position of a design surface as a design surface image over the partial surrounding image, based on the design surface information DG prestored in a nonvolatile storage that is a component of the remote controller 40. The design surface is a ground surface when excavation work using the shovel 100 is completed. By viewing the design surface, the operator can understand the state of an area surrounding the shovel 100 when the excavation work is completed even before the completion of the excavation work. In this case, the image synthesizing part 42 determines a position at which the design surface image is to be superimposed and displayed in the partial surrounding image, based on the position and orientation of the shovel 100 identified by the shovel state identifying part 32.

The operation signal generating part 43 is configured to generate an operation signal. According to this embodiment, the operation signal generating part 43 is configured to generate an operation signal based on the output of the operation sensor 29.

Next, functions of the controller 50 installed in the information center 200 are described. The controller 50 is a processor that executes various operations. According to this embodiment, the controller 50 is constituted of a microcomputer including a CPU and a memory, the same as the controller 30 and the remote controller 40. Various functions of the controller 50 are implemented by the CPU executing programs stored in the memory.

According to this embodiment, the controller 50 includes, as functional blocks, a determination part 51, an operation predicting part 52, an operation intervention part 53, and a motion simulator 54. The determination part 51, the operation predicting part 52, the operation intervention part 53, and the motion simulator 54, which are separately represented for the convenience of description, do not have to be physically separated and may be constituted entirely or partly of a common software component or hardware component.

The determination part 51 is configured to determine whether there is a matter to report to the operator of the shovel 100 with respect to a situation in an area surrounding the shovel 100. According to this embodiment, the determination part 51 is configured to determine whether there is a matter to report to the operator of the shovel 100 based on at least one of an image or distance image (hereinafter "image or the like") captured by the space recognition device C1 serving as an information obtaining device attached to the shovel 100, the position of the shovel 100, the pose of the shovel 100, and the motion details of the shovel 100. The distance image is, for example, an image generated based on the output of a LIDAR or the like serving as the space recognition device C1. The determination part 51 may be configured to be able to determine at least one of the position, pose, and motion details of the shovel 100 based on an image or the like captured by the space recognition device C1. Furthermore, the determination part 51 may also be configured to determine whether there is a matter to report to the operator of the shovel 100, based on an image or the like captured by the space recognition device C3 or construction terrain information (terrain data). Furthermore, the determination part 51 may be configured to be able to determine at least one of the position, pose, and motion details of another construction machine based on an image or the like captured by the space recognition device C3. The determination part 51 may determine whether there is a matter to report to the operator of the shovel 100, based on a situation in an area surrounding the shovel 100 derived from images or the like obtained by the space recognition device C1 and the space recognition device C3 and the position, pose, and motion details of the shovel 100. Whether there is a matter to report may be determined based on the presence or absence of the same or a similar situation in light of past cases.

For example, the determination part 51 determines that there is a matter to report to the operator in response to detecting the presence of a person outside the coverage of an image displayed on the display device D1. For example, the determination part 51 determines that there is a matter to report to the operator in response to detecting the presence of a person diagonally behind the shovel 100 to the left. In this case, the determination part 51 may detect a person based on the output of an image capturing device, LIDAR, or the like serving as the space recognition device C1 attached to the upper swing structure 3. The determination part 51 may also detect a person based on the output of an image capturing device, LIDAR, or the like serving as the space recognition device C3 installed in the worksite. In this case, the space recognition device C3 may be, for example, a hemisphere camera attached to the top of a pole installed in the worksite. The space recognition device C3 may be an image capturing device, LIDAR, or the like attached to another work machine or may be an image capturing device, LIDAR, or the like attached to an aerial vehicle such as a multicopter (drone) flying over the worksite. The same applies to the case of detecting a person within the coverage of an image displayed on the display device D1.

Furthermore, the determination part 51 may determine that there is a matter to report to the operator in response to detecting the presence of an electrical wire outside the coverage of an image displayed on the display device D1. For example, the determination part 51 determines that there is a matter to report to the operator in response to detecting the presence of an electrical wire above the shovel 100. In this case, the determination part 51 may detect the electrical wire based on the output of the space recognition device C1. The determination part 51 may also detect the electrical wire based on an image or the like captured by the space recognition device C3. The same applies to the case of detecting an electrical wire within the coverage of an image displayed on the display device D1.

The determination part 51 determines that there is a matter to report to the operator in response to detecting the presence of a downslope in front of the shovel 100 based on the construction terrain information (terrain data). For example, the determination part 51 determines that there is a matter to report to the operator in response to detecting the presence of a downslope in front of the shovel 100. In this case, the determination part 51 may detect the downslope based on the output of an object detector. The determination part 51 may also detect the downslope based on an image or the like captured by the space recognition device C3. The determination part 51 may also detect the downslope based on the construction terrain information (terrain data) pre-stored in a nonvolatile storage medium or the like attached to the controller 50.

In response to determining that there is a matter to report to the operator of the shovel 100, the determination part 51 alerts the operator. According to this embodiment, the determination part 51 transmits information on the matter to report to the remote controller 40. The image synthesizing part 42 of the remote controller 40 superimposes and displays an image related to the information received from the determination part 51 over the partial surrounding image.

The operation predicting part 52 is configured to predict an operation signal after a predetermined time based on an operation signal received from the remote controller 40. This is for reducing a decrease in operation responsiveness due to communication delay, namely, a delay before an operation performed by the operator OP in the remote control room RC is reflected in the movement of the shovel 100. The predetermined time is, for example, several milliseconds to several dozen milliseconds. For example, the operation predicting part 52 predicts an operation signal after a predetermined time based on changes in the operation signal (the inclination angle of an operating lever) during a predetermined period of time in the past. For example, in response to detecting an increasing trend in the inclination angle of an operating lever during a predetermined period of time in the past, the operation predicting part 52 predicts that the inclination angle after the predetermined time is greater than the current inclination angle.

Instead of transmitting the operation signal received from the remote controller 40 directly to the shovel 100, the operation predicting part 52 transmits the operation signal that has been predicted (hereinafter "predicted operation signal") to the shovel 100.

This configuration enables the operation predicting part 52 to transmit an operation signal generated in the remote control room RC to the shovel 100 without a substantial delay.

The operation intervention part 53 is configured to intervene in an operation performed by the operator OP in the remote control room RC. According to this embodiment, the operation intervention part 53 is configured to determine whether to intervene in an operation performed by the operator OP based on an image or the like captured by the space recognition device C1 attached to the shovel 100.

For example, the operation intervention part 53 determines to intervene in an operation performed by the operator OP in response to detecting a possible contact between the shovel 100 and an object in an area surrounding the shovel 100. For example, the operation intervention part 53 determines to intervene in an operation performed by the operator OP in response to detecting the presence of a person to the left of the shovel 100 and detecting the start of a counterclockwise swing operation (the operation of tilting a left operating lever leftward). In this case, the operation intervention part 53 disables an operation signal generated based on the counterclockwise swing operation to prevent the upper swing structure 3 from swinging counterclockwise. The operation intervention part 53 may detect a possible contact between the shovel 100 and an object in an area surrounding the shovel 100 based on the output of an object detector. The operation intervention part 53 may detect a possible contact between the shovel 100 and an object in an area surrounding the shovel 100 based on an image or the like captured by the space recognition device C3. The controller 30 may be configured to perform braking control such as stopping or decelerating the shovel 100 based on the operation signal when it is thus determined that there is a matter to be reported to the operator.

Thereafter, the operator can cancel the braking control such as stopping or decelerating the shovel 100 by, for example, performing an operation such as returning the operating lever to neutral or pressing a cancellation button, namely, satisfying a cancellation condition. The cancellation condition may include the shovel 100 being stopped.

The motion simulator 54 is configured to be able to carry out a mock experiment (a simulation) of the motion of the shovel 100. The motion of the shovel 100 constitutes various types of work performed by the shovel 100, such as excavation work. For example, the excavation work is constituted of multiple motions such as an arm closing motion, a bucket closing motion, and a boom raising motion. According to the example illustrated in FIG. 6, the motion simulator 54 starts to simulate the motion of the shovel 100 in response to a start command from the remote control room RC. Specifically, the motion simulator 54 constructs (i.e., builds) a virtual worksite that is a virtual model of the worksite based on environmental information. The environmental information is information on a work environment and includes information output by at least one of the space recognition device C1, the space recognition device C3, the positioning device 18, and a pose detection sensor. Furthermore, the environmental information may include the design surface information DG.

The virtual worksite is an example of a virtual environment, and is, for example, a three-dimensional space (a three-dimensional model) where the current terrain of an actual worksite is reproduced. The motion simulator 54 transmits an image related to the virtual worksite to the display device D1 so that the operator OP in the remote control room RC can view a situation in the virtual worksite. A virtual shovel is disposed in the three-dimensional virtual space. The virtual shovel is disposed in the virtual worksite reproduced in the virtual space such that the current terrain, the position and orientation of the virtual shovel, etc., in the virtual worksite coincide with the current terrain, the position and orientation of the actual shovel 100, etc., in the actual worksite. The virtual shovel makes a virtual motion in the virtual worksite in the same manner as the actual shovel 100. That is, when the operator OP switches the connection destination of the operating device 26 from the actual shovel 100 to the virtual shovel, the operator OP can operate the virtual shovel via the operating device 26. For example, the operator OP can move the virtual arm of the virtual shovel by operating the left operating lever (arm operating lever) of the operating device 26. In this manner, the operator OP can move each actuator of the virtual shovel in the virtual worksite. Furthermore, when an object such as a building or electric wire is installed in the actual worksite, the installed object is virtually reproduced in the virtual worksite as well. Furthermore, when a material is scheduled to be delivered to the actual worksite at a predetermined time, a situation where a virtual material is delivered to the virtual worksite as well at the predetermined time as scheduled is reproduced. Furthermore, the ground characteristics (such as hardness, density, and moisture content rate) of the ground, slope, etc., of the virtual worksite are reproduced to coincide with the ground characteristics of the actual worksite. Furthermore, when a rainfall is expected at a predetermined time, a situation where rain falls at the predetermined time as expected in the virtual worksite as well is virtually reproduced. Thus, a three-dimensional virtual space is reproduced as a three-dimensional model. This enables the operator OP in the remote control room RC to perform virtual work at the virtual worksite reproduced in the virtual space, using the model of a virtual shovel placed in the three-dimensional virtual space. The image that the operator OP in the remote control room RC views when performing virtual work corresponds to an image of the virtual worksite obtained from a virtual space recognition device attached to the virtual shovel disposed in the three-dimensional virtual space. The virtual space recognition device is placed in a virtual cabin, for example. The image related to the virtual worksite is typically a stereoscopic terrain image corresponding the terrain of the actual worksite, and is constituted of a computer-generated graphic. The image related to the virtual worksite, however, may at least partially be generated using an image captured by an image capturing device. In response to receiving the image related to the virtual worksite, the display device D1 can display an image of the virtual worksite. The current terrain of the actual worksite may be obtained through the space recognition device C1 (a camera, LIDAR, or the like) provided in the shovel 100 or a space recognition device (a camera, LIDAR, or the like) provided on a multicopter or the like, or may be obtained through a space recognition device (a camera, LIDAR, or the like) installed at a building, steel tower, or the like in the actual worksite. Thus, the motion simulator 54 can reproduce the actual worksite in a three-dimensional virtual space (a three-dimensional model) based on information obtained through the space recognition device. The virtual worksite in the three-dimensional virtual space (three-dimensional model) may be updated according to progress in the actual worksite. For example, when there is a fallen tree in the actual worksite, the shovel 100 obtains information on the fallen tree (position, size, tree type, etc.) in the actual worksite through the space recognition device C1, and transmits the information to the controller 50 serving as a management apparatus installed in the information center 200. The controller 50 reflects the received latest information on the actual worksite in the virtual worksite. This enables the operator OP to operate the virtual shovel to perform virtual work in view of the fallen tree at the virtual worksite.

The image related to the virtual worksite typically includes a virtual shovel image. For example, at the start of the simulation of the motion of the shovel 100, the virtual shovel corresponds to the shovel 100 at the actual worksite. That is, the position, pose, etc., of the virtual shovel in the virtual worksite at the start of the simulation corresponds to the position, pose, etc., of the shovel 100 in the actual worksite. The position, pose, etc., of the virtual shovel in the virtual worksite at the start of the simulation are determined based on, for example, the output of at least one of the space recognition device C1 and the space recognition device C3. The position, pose, etc., of the virtual shovel in the virtual worksite at the start of the simulation, however, may be determined or adjusted based on the output of at least one of the boom angle sensor S1, the arm angle sensor S2, the bucket angle sensor S3, the swing angular velocity sensor S4, a machine body tilt sensor, the positioning device 18, etc., mounted on the shovel 100.

Thereafter, the motion simulator 54 receives an operation signal generated when the operator OP in the remote control room RC operates the operating device 26 from the remote control room RC, and moves the virtual shovel at the virtual worksite according to the received operation signal. The terrain of the virtual worksite changes according as the virtual shovel moves. For example, the terrain of the virtual worksite changes according to virtual excavation work performed by the virtual shovel.

During the simulation, no operation signal is transmitted to the shovel 100 at the actual worksite. That is, during the simulation, the operator OP in the remote control room RC cannot operate the shovel 100 at the actual worksite.

According to the example illustrated in FIG. 6, a start command for starting the simulation is generated in the remote controller 40 when the operator OP in the remote control room RC operates a predetermined start button, and is transmitted from the remote controller 40 to the controller 50 of the information center 200. The start button is, for example, placed at the upper surface of the right console box.

The operator OP, who performs operations from the remote control room RC, may have difficulty in understanding a situation in the actual worksite. Therefore, it is desirable for the operator OP to understand the probability of the occurrence of an undesirable event at the actual worksite where the shovel 100 is present before the occurrence of the undesirable event, before the start of work or during work. Therefore, before actually performing scheduled work, the operator OP operates the predetermined start button to start the simulation. Examples of undesirable events include the collapse of a cliff when the cliff is excavated. Here, the cliff means, for example, the ground including a slope having an inclination angle greater than or equal to the angle of repose. By performing virtual excavation work with the virtual shovel at the virtual worksite, the operator OP can check how the cliff is collapsed by the way of excavating the cliff. That is, by virtually trying excavation work multiple times, the operator OP can determine which parts of the cliff are to be excavated to what extent in what order to prevent the collapse of the cliff. That is, the operator OP can arrive at a problem-free way of proceeding with excavation work before performing actual excavation work (without performing actual excavation work).

Specifically, after virtually trying excavation work, the operator OP may operate a predetermined reset button to restore the original terrain of the virtual worksite whose terrain has been changed by the tried excavation work. The reset button is, for example, placed at the upper surface of the right console box. The original terrain is, for example, the terrain of the virtual worksite at the time of the operation of the start button, and corresponds to a current terrain at the actual worksite. The terrain of the virtual worksite, however, may be returned to the terrain of any point of time in the simulation. This configuration enables the operator OP to efficiently try varieties of excavation work.

After determining excavation work that is less likely to cause the collapse of the cliff, the operator OP ends the simulation. According to the example illustrated in FIG. 6, the operator OP may operate a predetermined end button to terminate the simulation. The end button may be the same button as the start button used to start the simulation, or may be a button different from the start button.

When the simulation ends, the image of the virtual worksite displayed on the display device D1 is switched to the image of the actual worksite based on an image captured by an image capturing device or the like mounted on the shovel 100. By operating the operating device 26, the operator OP can move the shovel 100 to perform actual excavation work.

In this state, the operator OP can perform the best possible excavation work confirmed by the simulation to excavate the cliff at the actual worksite.

This configuration enables the controller 50 to, for example, prevent the collapse of the cliff that may occur during the excavation of the cliff to increase the safety of excavation work performed by the shovel 100.

The controller 50 may also be configured to stop the movement of the shovel 100 and encourage the operator OP to perform the simulation, in response to determining that an undesirable event is very likely to occur as the shovel 100 moves. Examples of undesirable events include the collapse of a cliff that may occur during the excavation of the cliff.

For example, the controller 50 may also be configured to stop the movement of the shovel 100 and encourage the operator OP to perform the simulation, in response to determining, based on the output of the space recognition device C1 or the like, that the operator OP is going to excavate a cliff.

Figure 7:
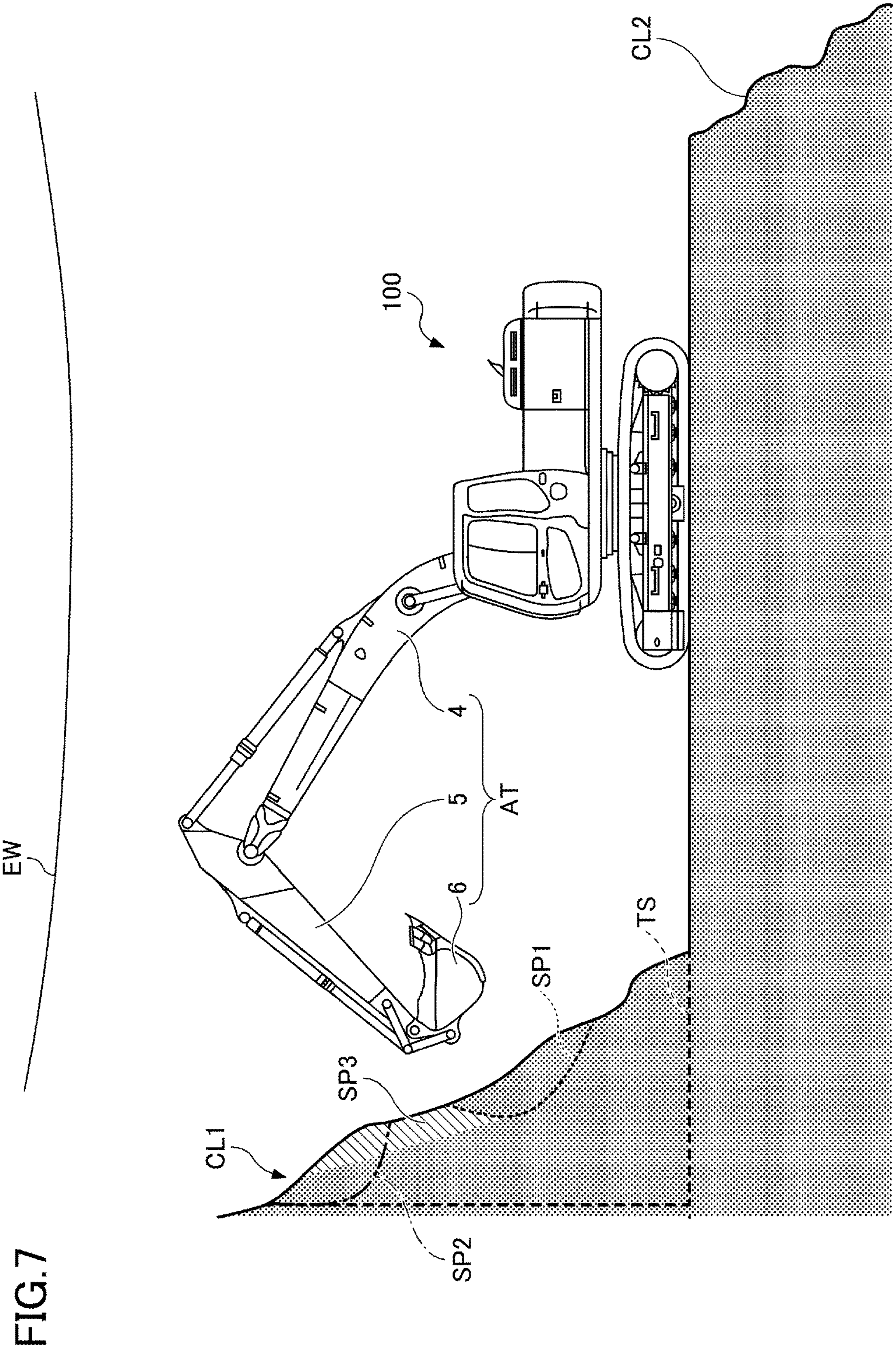
FIG. 7 is a side view of the shovel at a worksite.

Next, an effect of the simulation executed by the motion simulator 54 in the controller 50 is described with reference to FIG. 7. FIG. 7 is a side view of the shovel 100. According to the example illustrated in FIG. 7, the operator OP of the shovel 100 intends to perform excavation work to excavate a cliff CL1 to expose a design surface TS. The operator OP remotely controls the shovel 100 using the operating device 26 installed in the remote control room RC. The operator OP presses the start button installed in the remote control room RC to start the simulation before excavating the cliff CL1.

In response to the pressing of the start button, the remote controller 40 installed in the remote control room RC generates a start command and transmits the start command to the controller 50 (the motion simulator 54) of the information center 200.

In response to receiving the start command, the motion simulator 54 identifies the terrain of the actual worksite in an area surrounding the shovel 100 based on the output of a LIDAR serving as the space recognition device C1 attached to the shovel 100, and generates a stereoscopic terrain image of the virtual worksite corresponding to the terrain of the worksite.

The stereoscopic terrain image generated by the motion simulator 54 is transmitted to the display device D1 installed in the remote control room RC and is displayed on the display device D1.

The operator OP can operate the operating device 26 to move the virtual shovel while viewing the stereoscopic terrain image displayed on the display device D1.

According to the example illustrated in FIG. 7, the simulation allows the operator OP to try first excavation work to first excavate an earth portion SP1 delimited by a dotted line and second excavation work to first excavate an earth portion SP2 delimited by a one-dot chain line, for example.

By trying the first excavation work, the operator OP can be aware that an earth portion SP3 indicated by oblique lines collapses as a result of excavating the earth portion SP1 first. Furthermore, by trying the second excavation work, the operator OP can be aware that excavating the earth portion SP2 first does not cause the collapse of other earth portions. In this case, based on the results of the simulation, the operator OP may perform the second excavation work as excavation work performed at the actual worksite. Alternatively, the operator OP may perform the first excavation work as excavation work performed at the actual worksite to make positive use of the collapse of the earth portion SP3.

Figure 8:
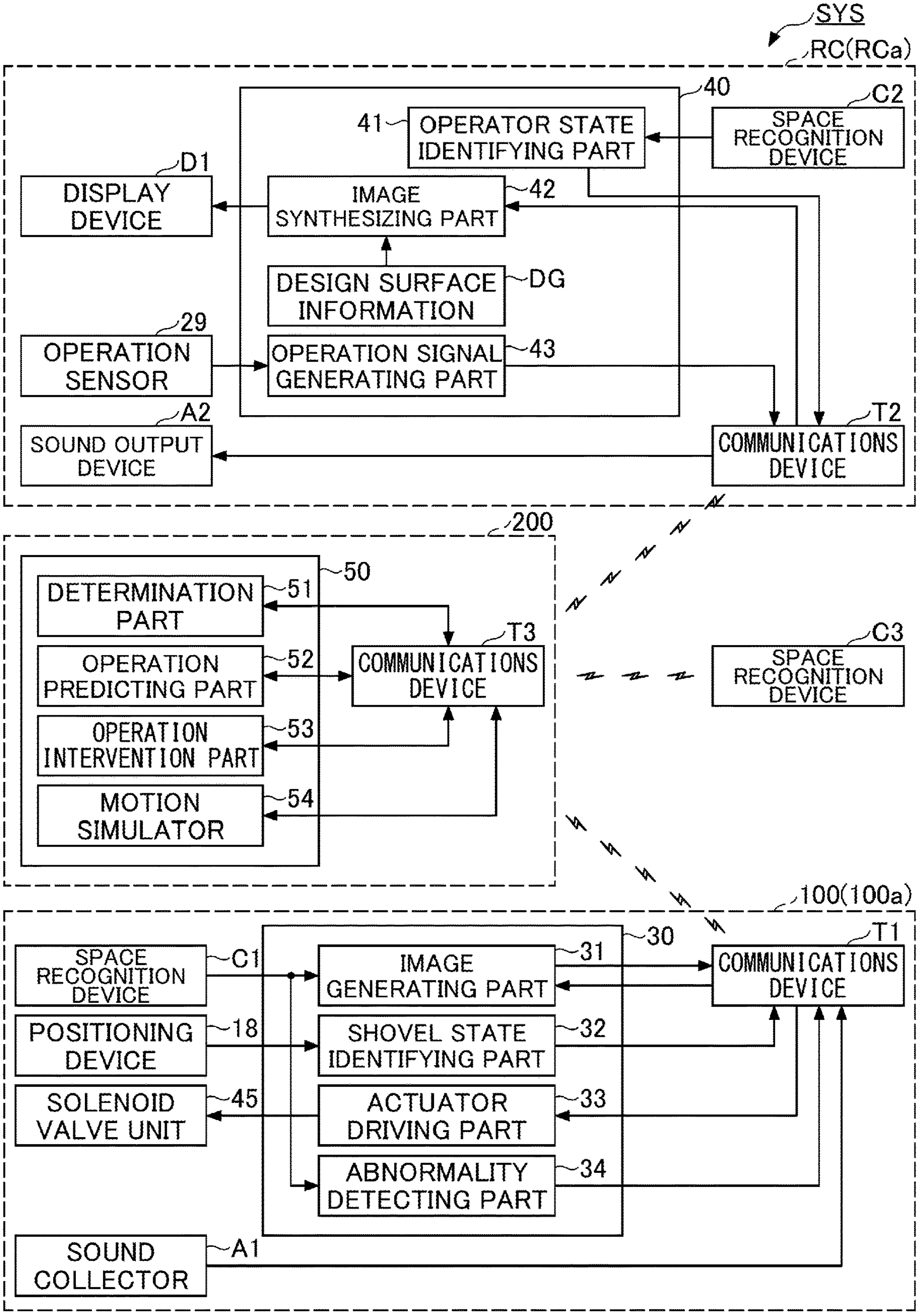
FIG. 8 is a functional block diagram illustrating another example configuration of the construction assist system.

Next, another example configuration of the construction assist system SYS for the shovel 100 is described with reference to FIG. 8. FIG. 8 is a functional block diagram illustrating another example configuration of the construction assist system SYS, and corresponds to FIG. 6.

The construction assist system SYS illustrated in FIG. 8 is different from the construction assist system SYS illustrated in FIG. 6 in that the controller 30 installed in the shovel 100 includes an abnormality detecting part 34, but otherwise, is equal to the construction assist system SYS illustrated in FIG. 6. Therefore, in the following, a description of a common part is omitted, and differences are described in detail.

The abnormality detecting part 34 is configured to detect abnormal events that occur in an area surrounding the shovel 100. According to the example illustrated in FIG. 8, the abnormality detecting part 34 is configured to detect abnormal events that occur in an area surrounding the shovel 100 in advance based on the output of the space recognition device C1, in order to prevent the occurrence of abnormal events. Examples of abnormal events that occur in an area surrounding the shovel 100 include the fall of the shovel 100 from a cliff CL2 (see FIG. 7) and the contact between the excavation attachment AT of the shovel 100 and an electrical wire EW (see FIG. 7).

The abnormality detecting part 34, for example, identifies the presence of the cliff CL2 based on the output of the space recognition device C1, and determines that the ground near the cliff CL2 may collapse if the shovel 100 enters an area of a predetermined distance from the cliff CL2. The predetermined distance may be a value preset based on at least one of data on past cases, the characteristics of the earth of the ground, data on the weight of the shovel 100, or may be a value that is dynamically determined.

When the shovel 100 approaches the area of the predetermined distance from the cliff CL2, the abnormality detecting part 34 may alert the operator OP of the shovel 100 by displaying information on an abnormality on the display device D1, may slow the movement of the shovel 100, or may stop the movement of the shovel 100.

The abnormality detecting part 34, for example, identifies the presence of the electrical wire EW based on the output of the space recognition device C1, and when the upper end of the excavation attachment AT (the aim 5) enters an area of a predetermined distance from the electrical wire EW, determines that the excavation attachment AT may contact the electrical wire EW. The predetermined distance may be a value preset based on data on past cases or the like, or may be a value that is dynamically determined.

When the upper end of the excavation attachment AT approaches the area of the predetermined distance from the electrical wire EW, the abnormality detecting part 34 may alert the operator OP of the shovel 100, may slow the movement of the excavation attachment AT, or may stop the movement of the excavation attachment AT.

Furthermore, the abnormality detecting part 34 may be configured to transmit information on the result of the identification of an object present in an area surrounding the shovel 100 and information on the result of the determination as to whether an abnormal event may occur to the information center 200 in order to make the information available to the motion simulator 54 in the information center 200.

In this case, the motion simulator 54 may be configured to alert the operator OP when the operator OP moves the virtual shovel toward the cliff CL2 in the simulation. The motion simulator 54 may also be configured to alert the operator OP by displaying information on an abnormality on the display device D1 when the operator OP raises the boom 4 to move the upper end of the excavation attachment AT (the arm 5) into the area of the predetermined distance from the electrical wire EW in the simulation. This configuration enables the motion simulator 54 to cause the operator OP to be aware of the presence of the cliff CL2 or the electrical wire EW to alert the operator OP to the cliff CL2 or the electrical wire EW during the execution of the simulation.

The shovel 100, which is operated by the operator OP in the remote control room RC according to the above-described embodiment, may also be operated by the operator in the cabin 10. In this case, the start button, the reset button, and the end button are installed in the cabin 10. The shovel 100 may alternatively be an autonomous shovel (an unmanned shovel) that requires no operator's operation. In this case, the start button, the reset button, and the end button may be omitted.

When the shovel 100 is an autonomous shovel, the shovel 100 is configured to perform work using a command (a motion command) with respect to a preset series of motions. The motion command is basically determined based on a work arrangement. The work arrangement means determining the kinds of motions that the shovel 100 is caused to perform and their order of performance. For example, the work arrangement means determining areas of a worksite are to be excavated and their order of excavation, taking various factors such as work efficiency and work safety into account. In a worksite where a common manned shovel is employed, typically, the work arrangement is determined based on the empirical judgment of a skilled operator. In a worksite where an autonomous shovel is employed as well, the work arrangement is basically so determined as to be an arrangement similar to the arrangement determined based on the empirical judgment of a skilled operator. Therefore, the work arrangement at a worksite where an autonomous shovel is employed is determined based on information on the worksite and various past data. In this case, techniques related to machine learning such as deep learning may be used.

Specifically, the motion command is determined by, for example, presetting a trajectory followed by a predetermined part such as the teeth tips of the bucket 6. The motion command is set in a desired manner. For example, the motion command may be automatically generated based on data on past trajectories. Machine learning such as deep learning may be used to generate the motion command. In this case, the "generation of a motion command" may also be referred to as the "learning of a motion command" or simply referred to as "motion learning."

The operator OP moves a virtual shovel such that a virtual current terrain in a three-dimensional virtual space generated by the output information of the space recognition device C1 becomes an intended surface in the virtual space (for example, a terrain based on the design surface information DG, etc.), and causes the controller 50 in the information center 200 to generate a motion command for the actual shovel 100. At this point, the controller 50 may generate a motion command for an actuator, using reinforcement learning, which is an example of machine learning, to set a reward (less used fuel, shorter working time, or the like). Thus, by using reinforcement learning, the controller 50 can generate a motion command with the highest reward to achieve a work arrangement of high efficiency when causing the virtual current terrain in the virtual space to be the intended surface in the virtual space (for example, a terrain based on the design surface information DG, etc.). This enables the controller 50 to generate a more efficient motion command and achieve a more efficient work arrangement than skilled operators.

Specifically, the controller 50 in the information center 200 generates a motion command for the shovel 100 based on the design surface information DG, etc. The controller 50 then generates an operation signal so as to be able to automatically move the shovel 100 according to the generated motion command. The generated operation signal is transmitted to the controller 30 installed in the shovel 100.

When the shovel 100 is an autonomous shovel, the motion simulator 54 of the controller 50 can simulate motions that constitute work performed by the shovel 100 before actual work is performed.

For example, the motion simulator 54 can virtually check changes in a terrain between the start and completion of construction (work) performed by the shovel 100 by virtually making motions constituting the work performed by the shovel 100 based on information on the motion command and information on the current terrain of the actual worksite. Here, the construction includes one or more pieces of work (loading work, compaction work, excavation work, hoisting work, etc.) that are performed according to a predetermined arrangement. Furthermore, the work includes one or more motions (excavating motion, swing motion, dumping motion, boom raising motion, etc.) that are performed in predetermined order.

The motion simulator 54 can recognize, in advance, a problem (an attention-demanding matter as an abnormal event) to occur when moving the shovel 100 according to the motion command. That is, the motion simulator 54 can determine the location and time of occurrence, type, etc., of the attention-demanding matter. Furthermore, when there are multiple construction machines in the virtual worksite, the motion simulator 54 can determine a construction machine with respect to which the attention-demanding matter is to occur. In this manner, the motion simulator 54 can extract an attention-demanding matter.

The extracted attention-demanding matter may be displayed on the display device of the management apparatus before the actual shovel 100 is operated. In this case, a three-dimensional virtual worksite that is a reproduction of the actual worksite is displayed on the display device. The motion simulator 54 causes the location and time of occurrence, type, etc., to be displayed with respect to the attention-demanding matter that occurs in the three-dimensional virtual worksite. The motion simulator 54 may cause the cause of the attention-demanding matter that occurs to be displayed. Furthermore, the motion simulator 54 may reproduce the behavior of a virtual construction machine (a virtual shovel) at the virtual worksite before and after the occurrence of the attention-demanding matter. This enables a manager to check how the attention-demanding matter occurs in advance. Furthermore, when there are multiple construction machines in the virtual worksite, the motion simulator 54 can determine with respect to which construction machine the attention-demanding matter occurs. For example, in the case where a virtual material is delivered to the virtual worksite at a scheduled time (for example, at 3:00 PM) based on the scheduled contents of work, when a virtual construction machine (a virtual shovel) performs excavation work near a location where the virtual material is unloaded (temporarily placed), "the contact between the virtual shovel and the virtual material" is extracted as the attention-demanding matter. In this case, displaying the location, time, type, etc., of the attention-demanding matter that occurs in the virtual worksite on the display device makes it possible for the manager to be aware of the necessity of changing the location for temporarily placing a material in the actual worksite. Furthermore, the motion simulator 54 can also display an improvement proposal for eliminating the occurrence of the attention-demanding matter. The display device may be the display part of a mobile terminal. In this case, the motion simulator 54 simulates a case where the location for unloading the virtual material is changed from a currently scheduled location to another location, for example. The case of changing the unloading location may be simulated with respect to multiple changed locations. Thus, by simulating multiple cases of changing the scheduled contents of work, the motion simulator 54 can extract a location for unloading the virtual material that is more preferable than a currently scheduled unloading location, and display the preferable loading location as an improvement proposal. An improvement proposal is thus displayed on the display device. This enables the manager to instruct a worker at a worksite to change a location for unloading a material in the actual worksite. Thus, when an event that occurs at the virtual worksite is an attention-demanding matter, the motion simulator 54 changes the contents of work one or more times and re-performs the simulation to eliminate the attention-demanding matter to occur. When the contents of work, a work arrangement or the like for eliminating the attention-demanding matter to occur is derived, the motion simulator 54 continues the simulation with respect to the subsequent construction based on the derived contents of work, a work arrangement or the like. Thus, even in the case of the occurrence of an attention-demanding matter, the motion simulator 54 can derive the contents of work for eliminating the attention-demanding matter through a simulation. Information on the contents of work, a work arrangement or the like for eliminating the attention-demanding matter determined by the motion simulator 54 is displayed on the display device. This enables the manager or worker to change the contents of work, a work arrangement or the like at the actual worksite. The display device may be the display part of a mobile terminal.

When modifying a motion command, the motion simulator 54 can identify an optimum motion command by simulating the motion of the shovel 100 according to multiple new motion commands. Multiple new motion commands may be generated using machine learning such as deep learning the same as in the case of the initial motion command.

Furthermore, the motion simulator 54 may be configured to perform a simulation as to what event will occur a predetermined time ahead in the future during the performance of actual work by the shovel 100 as an autonomous shovel. This configuration enables the motion simulator 54 to perform virtual work (a virtual motion) a predetermined time ahead of actual work to identify the occurrence of an undesirable event in advance. In the case of identifying the occurrence of an undesirable event in advance, the motion simulator 54 can modify a motion command to prevent the occurrence of such an undesirable event.

Furthermore, the motion simulator 54 may be configured to re-simulate the motion of the shovel 100 that constitutes the subsequent work in the case of the occurrence of an event that is different than expected. For example, the motion simulator 54 may be configured to, in response to determining that earth is more clayey or sandy than expected earth based on the outputs of various sensors mounted on the shovel 100, re-simulate the motion of the shovel 100 that constitutes the subsequent work. This is because sandy ground is more collapsible than clayey ground and affects the estimation result of a terrain that changes because of excavation work, etc. That is, this is because a simulation result derived based on being clayey is inappropriate for the ground that is actually sandier.

For example, the controller 50 can derive the amount of earth that collapses from the side surface of an excavated hole that is a hole famed by actual excavation to be deposited at the bottom of the excavated hole, based on the output of the space recognition device C1. The controller 50 can derive the characteristic of the ground to be worked on based on the amount of earth deposited at the bottom of the excavated hole. The characteristic of the ground is, for example, the degree of sandiness, the degree of being clayey, or the like. Typically, the controller 50 can determine that the larger the amount of earth deposited at the bottom of the excavated hole, the greater the degree of sandiness.

Furthermore, based on the output of the space recognition device C1, the controller 50 can evaluate progress in work by comparing a worksite situation at the actual worksite and a situation in the virtual worksite assumed in the virtual space. For example, when the actual work is delayed compared with the virtual work, the controller 50 causes the motion simulator 54 to re-perform the simulation based on the delayed situation in the actual worksite to re-generate a motion command. The controller 50 then transmits the re-generated motion command to the shovel 100. The shovel 100 is controlled based on the re-generated motion command. Furthermore, based on the output of the space recognition device C1, the controller 50 may determine the occurrence of an undesirable event that is not assumed (simulated) in the virtual worksite by comparing a worksite situation at the actual worksite and a situation in the virtual worksite assumed in the virtual space.

This configuration enables the controller 50 to increase the accuracy of the result of a simulation with respect to work performed by the shovel 100, and can increase the work efficiency of the shovel 100 as an autonomous shovel. Furthermore, the controller 50 can increase the safety of work performed by the shovel 100 as an autonomous shovel.

As described above, a system according to an embodiment of the present invention is the construction assist system SYS for a shovel to assist in construction with the shovel 100, and includes the controller 50 as a processor to simulate the motion of the shovel 100 in a virtual environment set based on the work environment of the shovel 100. The controller 50, for example, sets a virtual worksite that is an example of the virtual environment based on information on a worksite where the shovel 100 is located, and performs the simulation of a virtual motion that constitutes virtual excavation work performed by a virtual shovel at the virtual worksite. Specifically, the controller 50 derives how the virtual worksite is changed by what virtual motion.

According to this configuration, by simulating work performed by the shovel 100 based on information on the actual worksite, the construction assist system SYS can reflect a situation at the actual worksite when assisting in construction with the shovel 100.

The controller 50 may perform the simulation based on the output of a space recognition device that recognizes a space around the shovel 100. The space recognition device may be mounted on the shovel 100 or may be installed outside the shovel 100. Furthermore, the controller 50 may perform the simulation based on the output of a single space recognition device or may pertain the simulation based on the outputs of multiple space recognition devices. The space recognition device may be, for example, the space recognition device C1 mounted on the shovel 100. The space recognition device may also be the space recognition device C3 installed outside the shovel 100. Specifically, the space recognition device C3 may be attached to a pole installed at a worksite, may be attached to a shovel other than the shovel 100, or may be attached to an aerial vehicle flying above a worksite.

The construction assist system SYS may include a display device that displays the result of the simulation performed by the controller 50.

The controller 50 may be configured to be able to identify an event that may occur when actually moving the shovel 100 in advance through the simulation. This configuration enables the construction assist system SYS to identify an undesirable event that may occur when actually moving the shovel 100 in advance to prevent the actual occurrence of such an undesirable event.

The shovel 100 may be an autonomous shovel. In this case, the controller 50 may generate an operation signal based on information on a preset motion command. The shovel 100 may be configured to move according to the operation signal. The controller 50 may be configured to change the motion command based on the result of the simulation.

This configuration enables the construction assist system SYS to reflect a situation in the actual worksite when assisting in construction with the shovel 100 even when the shovel 100 is an autonomous shovel.

The controller 50 may be configured to continuously derive, through the simulation, the future condition of the worksite after passage of a predetermined time achieved by the shovel 100 that moves according to the motion command.

This configuration enables the construction assist system SYS to actually move the shovel 100 and derive the condition of the worksite a predetermined time ahead in the future in real time through the simulation. Therefore, the construction assist system SYS can determine in advance that the condition of the worksite a predetermined time ahead in the future is undesirable. In this case, by switching a currently used motion command to another motion command, the construction assist system SYS can prevent the actual occurrence of such an undesirable condition.

The controller 50 may be configured to re-perform the simulation in response to a change in the precondition of the simulation. The precondition of the simulation is, for example, that the degree of sandiness of earth to be worked on is a value within a predetermined range. The degree of sandiness of earth is, for example, derived based on the output of a space recognition device. This is because if the result of a simulation performed based on a precondition is used although there has been a change in the precondition, the condition of the worksite becomes undesirable.

As another case, for example, when a space recognition device detects the displacement of an iron plate laid on the road surface of a construction site due to the frequent passage of dump trucks, an earthquake, or the like, the controller 50 may determine the occurrence of an attention-demanding matter to so alert the manager or worker and determine a change in the precondition to re-perform the simulation. The controller 50 may evaluate the effect of the change in the precondition on construction work. If there is an immediate need for the correction of the position of the iron plate, the controller 50 may so notify the manager or worker using display or the like.

Furthermore, as another case, when the space recognition device C1 detects a change in a situation in the worksite, the controller 50 may determine the occurrence of an attention-demanding matter to so alert the manager or worker and determine a change in the precondition to re-perform the simulation. Examples of changes in a situation in the worksite include a change in the terrain of the worksite (such as a change in the shape of a slope or the shape of temporarily placed earth) due to inclement weather (such as rain) and the occurrence of a treefall or rockfall. The controller 50 may evaluate the effect of the change in the precondition on construction work. If there is an immediate need for improvement of the situation such as the correction of the terrain of the worksite, the controller 50 may so notify the manager or worker using display or the like. The motion simulator 54 may perform a simulation for correcting the terrain of the worksite.

Thus, before the start of construction or at predetermined intervals during construction, the controller 50 receives the output of the space recognition device C1. Based on the output of the space recognition device C1, the controller 50 compares a worksite situation in the actual worksite and a situation in the virtual worksite assumed in the virtual space. In response to determining that there is a change in the precondition of the simulation based on the result of the comparison, the controller 50 determines whether the change in the precondition is an attention-demanding matter. In response to determining that the change in the precondition is an attention-demanding matter, the controller 50 so notifies the manager or worker. Then, the controller 50 performs a simulation to eliminate the attention-demanding matter. In response to deriving the contents of work, a work arrangement or the like for eliminating the attention-demanding matter that has occurred as an improvement proposal, the controller 50 notifies the manager or worker of the derived improvement proposal. In response to determining that the improvement proposal derived by the motion simulator 54 is acceptable, the manager or worker enables the controller 50 to transmit a motion command to the shovel 100. Thereafter, the controller 50 transmits a motion command to the shovel 100. The controller 30 controls the shovel 100 based on the received motion command.

According to this configuration, the construction assist system SYS re-performs a simulation in response to determining that there is a change in the precondition of the simulation. Therefore, the construction assist system SYS can more appropriately reflect a situation in the actual worksite when assisting in construction with the shovel 100.

An embodiment of the present invention is described in detail above. The present invention, however, is not limited to the above-described embodiment. Various variations, substitutions, etc., may be applied to the above-described embodiment without departing from the scope of the present invention. Furthermore, separately described features may be combined to the extent that no technical contradiction is caused.

For example, the motion simulator 54, which is implemented as a function of the controller 50 installed in the information center 200 according to the above-described embodiment, may be implemented as a function of the controller 30 or may be implemented as a function of the remote controller 40. The motion simulator 54 may alternatively be implemented as a function of a processor that is different from each of the controller 30, the remote controller 40, and the controller 50.

What is claimed is:

1. A construction assist system for a shovel to assist construction with the shovel, comprising:

a space recognition device configured to recognize a space around the shovel, the space recognition device being mounted on the shovel or installed in a worksite outside the shovel;

a memory storing a program; and a hardware processor coupled to the memory and configured to execute the program to perform a simulation of a motion of the shovel in a virtual worksite set based on a work environment of the shovel, the virtual worksite being a three-dimensional virtual space where a current terrain of an actual worksite is reproduced, wherein the hardware processor is further configured to build the virtual worksite based on an output of the space recognition device, the hardware processor is further configured to dispose a virtual shovel in the virtual worksite such that the current terrain and a position and an orientation of the virtual shovel in the virtual worksite coincide with the current terrain and a position and an orientation of the shovel in the actual worksite, based on an output of a positioning device configured to measure the position of the shovel in the actual worksite, the hardware processor is further configured to move the virtual shovel according to an operation signal, and the hardware processor is further configured to determine whether an undesirable event is likely to occur as the shovel in the actual worksite moves, and to stop a movement of the shovel in the actual worksite and notify an operator of the shovel to perform the simulation in response to determining that the undesirable event is likely to occur as the shovel in the actual worksite moves.

2. The construction assist system as claimed in claim 1, wherein the virtual worksite is assumed in a virtual space.

3. The construction assist system as claimed in claim 1, further comprising:

a display configured to display a result of the simulation performed by the hardware processor.

4. The construction assist system as claimed in claim 1, wherein the hardware processor is further configured to execute the program to identify in advance, through the simulation, an event that occurs when the shovel is actually moved.

5. The construction assist system as claimed in claim 4, wherein the hardware processor is further configured to execute the program to simulate contents of work for eliminating an attention-demanding matter when the event is the attention-demanding matter.

6. The construction assist system as claimed in claim 1, wherein the shovel is an autonomous shovel, the hardware processor is further configured to execute the program to generate the operation signal based on information on a motion command with respect to a preset series of motions, and the hardware processor is further configured to move the virtual shovel according to the operation signal during the simulation and move the shovel according to the operation signal when the simulation is not performed.

7. The construction assist system as claimed in claim 6, wherein the hardware processor is further configured to execute the program to change the motion command based on a result of the simulation.

8. The construction assist system as claimed in claim 6, wherein the hardware processor is further configured to execute the program to derive, through the simulation, a future condition of the actual worksite after passage of a predetermined time, the future condition being achieved by the shovel that moves according to the motion command.

9. The construction assist system as claimed in claim 1, wherein the hardware processor is further configured to execute the program to determine a change in a precondition of the simulation based on the output of the space recognition device, and re-perform the simulation in response to determining the change in the precondition of the simulation.

10. The construction assist system as claimed in claim 1, wherein the virtual shovel is operated with an operating device.

11. The construction assist system as claimed in claim 10, wherein the operating device is selectively connected to the virtual shovel in the virtual worksite or the shovel disposed at the actual worksite.

12. The construction assist system as claimed in claim 1, wherein the hardware processor is further configured to execute the program to re-perform the simulation in response to a change in a precondition of the simulation.

13. The construction assist system as claimed in claim 4, wherein the hardware processor is further configured to execute the program to modify a motion command when the identified event is an undesirable event.

14. The construction assist system as claimed in claim 1, wherein the hardware processor is further configured to determine the occurrence of an event not assumed in the virtual worksite by comparing a worksite situation in the actual worksite and a situation in the virtual worksite.

15. The construction assist system as claimed in claim 14, wherein the event includes a delay in progress of the actual work compared with the virtual work.

16. The construction assist system as claimed in claim 1, wherein the hardware processor is further configured to execute the program to use the output of the space recognition device to compare a worksite situation in the actual worksite and a situation in the virtual worksite while the shovel is operating in the actual worksite.

17. The construction assist system as claimed in claim 1, wherein the hardware processor is further configured to execute the program to use the output of the space recognition device to compare a worksite situation in the actual worksite and a situation in the virtual worksite at a corresponding point in time in the simulation.

* * * * *